United States Patent
Akimoto et al.

(10) Patent No.: US 8,169,085 B2
(45) Date of Patent: May 1, 2012

(54) SEMICONDUCTOR DEVICE AND METHOD OF FABRICATING THE SAME

(75) Inventors: Yousuke Akimoto, Kanagawa (JP); Makoto Wada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 12/696,276

(22) Filed: Jan. 29, 2010

(65) Prior Publication Data

US 2011/0101528 A1    May 5, 2011

(30) Foreign Application Priority Data

Nov. 2, 2009  (JP) .................................. 2009-252189

(51) Int. Cl.
*H01L 23/48* (2006.01)
*H01L 23/52* (2006.01)

(52) U.S. Cl. ......... 257/784; 257/750; 977/720; 438/652

(58) Field of Classification Search .................. 257/750, 257/758, 784; 977/712, 720, 721, 762; 438/605, 438/622, 652
See application file for complete search history.

(56) References Cited

U.S. PATENT DOCUMENTS

| | | | |
|---|---|---|---|
| 8,013,286 B2* | 9/2011 | Ludwig | 250/214 A |
| 2011/0042649 A1* | 2/2011 | Duvall et al. | 257/27 |
| 2011/0062313 A1* | 3/2011 | Ludwig | 250/214 A |
| 2011/0092054 A1* | 4/2011 | Seo et al. | 438/473 |
| 2011/0220865 A1* | 9/2011 | Miyata et al. | 257/12 |
| 2011/0253969 A1* | 10/2011 | Dai et al. | 257/9 |

FOREIGN PATENT DOCUMENTS

| | | |
|---|---|---|
| JP | 2009-059869 | 3/2009 |
| JP | 2009-070911 | 4/2009 |
| JP | 2009-164993 | 7/2009 |
| JP | 2010-212619 | 9/2010 |

* cited by examiner

*Primary Examiner* — Sheila V. Clark
(74) *Attorney, Agent, or Firm* — Turocy & Watson, LLP

(57) ABSTRACT

A semiconductor device according to one embodiment includes: a substrate; a wiring provided above the substrate and including a graphene nanoribbon layer comprising a plurality of laminated graphene nanoribbon sheets; and a wiring connecting member penetrating at least one of the plurality of graphene nanoribbon sheets for connecting the wiring and a conductive member above or below the wiring.

20 Claims, 8 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2009-252189, filed on Nov. 2, 2009, the entire contents of which are incorporated herein by reference.

BACKGROUND

A conventional technique of using a multi-layer graphene sheet for a wiring is known. A graphene sheet is used for a wiring and it is thereby possible to obtain a wiring with ideal resistance by using ballistic conductivity of the graphene.

When a graphene sheet is used for a wiring, a wiring structure different from a conventional structure of a Cu wiring is required. For example, in a wiring body described in JP-A 2009-70911, a TiN electrode film is provided as a junction of a wiring with a contact plug. Therefore, a graphene sheet of each layer is connected to the contact plug through the TiN electrode film, and functions as a current path in the wiring.

However, according to the wiring body described in JP-A 2009-70911, since the wiring and the contact plug are indirectly connected through the TiN electrode film, there is a problem that a configuration of a connecting portion of the wiring with the contact plug is complicated. Therefore, there is a possibility that electrical resistance increases due to poor connection at the connecting portion, in addition to this, there is a problem that the number of processes is increased in order to form the TiN electrode film.

SUMMARY

A semiconductor device according to one embodiment includes: a substrate; a wiring provided above the substrate and including a graphene nanoribbon layer comprising a plurality of laminated graphene nanoribbon sheets; and a wiring connecting member penetrating at least one of the plurality of graphene nanoribbon sheets for connecting the wiring and a conductive member above or below the wiring.

A method of fabricating a semiconductor device according to another embodiment includes: forming a wiring above the substrate, the wiring including a graphene nanoribbon layer comprising a plurality of laminated graphene nanoribbon sheets; forming a hole penetrating at least one of the plurality of graphene nanoribbon sheets; and forming a wiring connecting member for connecting the wiring and a conductive member above or below the wiring by providing a conductive member into the hole.

DETAILED DESCRIPTION

Since electric conduction does not occur directly between the laminated graphene sheets, when a via or a contact plug is connected to an upper or lower surface of a wiring as in a conventional Cu wiring, only an uppermost or lowermost graphene sheet is connected to the via or the contact plug. In this case, graphene sheets other than the uppermost or lowermost graphene sheet cannot be used as a current path, in addition to this, when, for example, two vias are connected to the upper and lower surfaces of the wiring, it is not possible to flow current between the two vias.

[First Embodiment]

Figure 1A:
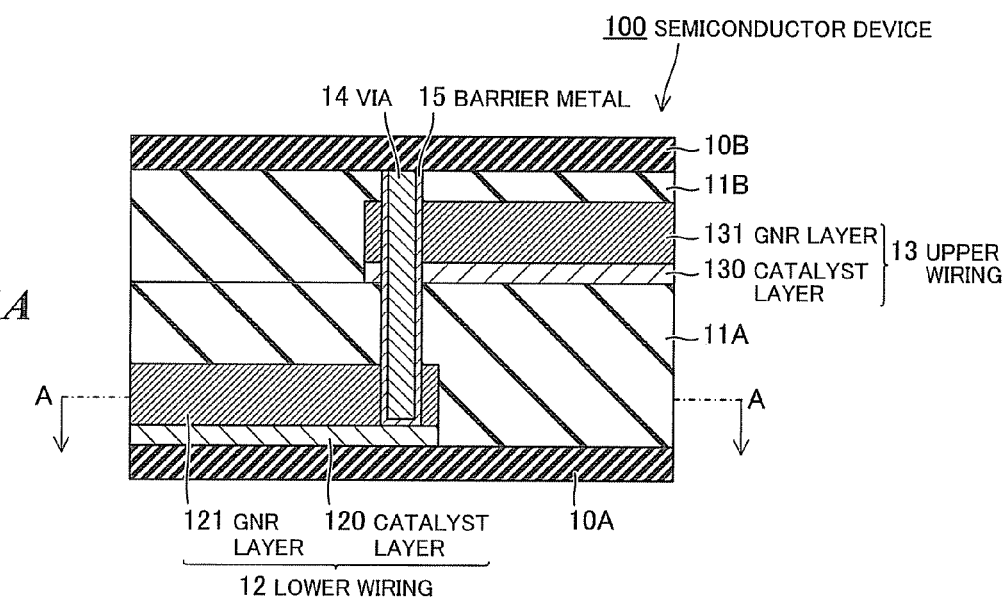
FIGS. 1A and 1B are vertical and horizontal cross sectional views of a semiconductor device according to a first embodiment.
Figure 1B:
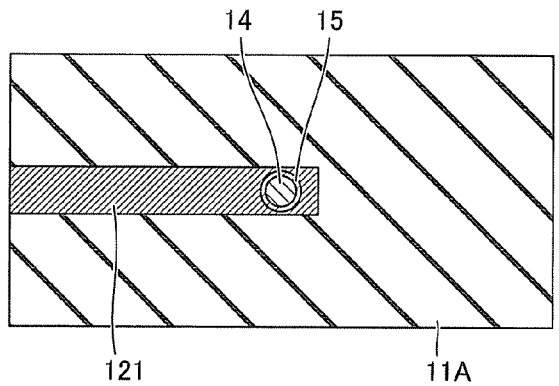

FIG. 1A is a vertical cross sectional view of a semiconductor device 100 according to a first embodiment. FIG. 1B is a horizontal cross sectional view of the semiconductor device 100 taken along line A-A of FIG. 1A.

The semiconductor device 100 has an insulating film 10A formed above a non-illustrated semiconductor substrate, an interlayer insulating film 11A on the insulating film 10A, an interlayer insulating film 11B on the interlayer insulating film 11A, an insulating film 10B on the interlayer insulating film 11B, a lower wiring 12 in the interlayer insulating film 11A, an upper wiring 13 in the interlayer insulating film 11B, and a via 14 for electrically connecting the lower wiring 12 to the upper wiring 13.

The lower wiring 12 is composed of a catalyst layer 120 and a GNR (Graphene Nano Ribbon) layer 121 thereon. Meanwhile, the upper wiring 13 is composed of a catalyst layer 130 and a GNR layer 131 thereon.

The catalyst layers 120 and 130 are made of catalyst material which functions as a catalyst for growing graphene composing the GNR layers 121 and 131. As a catalyst material, for example, Co, Ni, Ru, Fe or a compound containing these metals is used.

The GNR layers 121 and 131 are composed of one to several tens of GNR sheets which are grown by using the catalyst layers 120 and 130 as a catalyst, and have ballistic conduction properties. In the GNR layers 121 and 131, the ballistic conduction occurs independently in each GNR sheet and plural current paths are formed in parallel.

Here, the GNR sheet is a single graphene sheet which is processed so as to have a fine line width. The layer number of the GNR sheets is preferably 10 layers or less so that the GNR layers 121 and 131 have higher conduction properties, and using fewer layers is especially preferable. When the layer number of the GNR sheets is greater than 10 layers, the characteristics of the GNR layers 121 and 131 come close to that of graphite and there is a possibility that the conduction properties deteriorate.

It is known that a mean free path of electron in the graphene is about 100 nm-1 μm, and it is further longer compared with a mean free path of electron in Cu (about 40 nm) which is a low resistance metal material currently used for various LSI devices. The graphene has quantum conduction properties and is more advantageous for long-distance electric conduction. In a conventional metal wiring, influence of electron scattering effect at an interface between a wiring and an insulating film becomes remarkable as miniaturization of the wiring proceeds, and a resistance increase due to interface electron scattering is not avoidable. In contrast, the resistance increase due to interface scattering is less in the graphene due to the quantum conduction. Therefore, it is possible to lower the resistance of the wiring by using a graphene layer for a wiring material.

Since the lower wiring 12 and the upper wiring 13 have a narrow line width and low electrical resistance, they are suitable for an ultrafine wiring structure.

The via 14 is made of, e.g., metal such as W, Cu or Al.

A barrier metal 15 is made of, e.g., metal such as Ta, Ti, Ru, Mn, Co, or nitride containing these metals. In addition, the barrier metal 15 has a function of preventing diffusion of metal contained in the via 14 to the outside.

Figure 2:
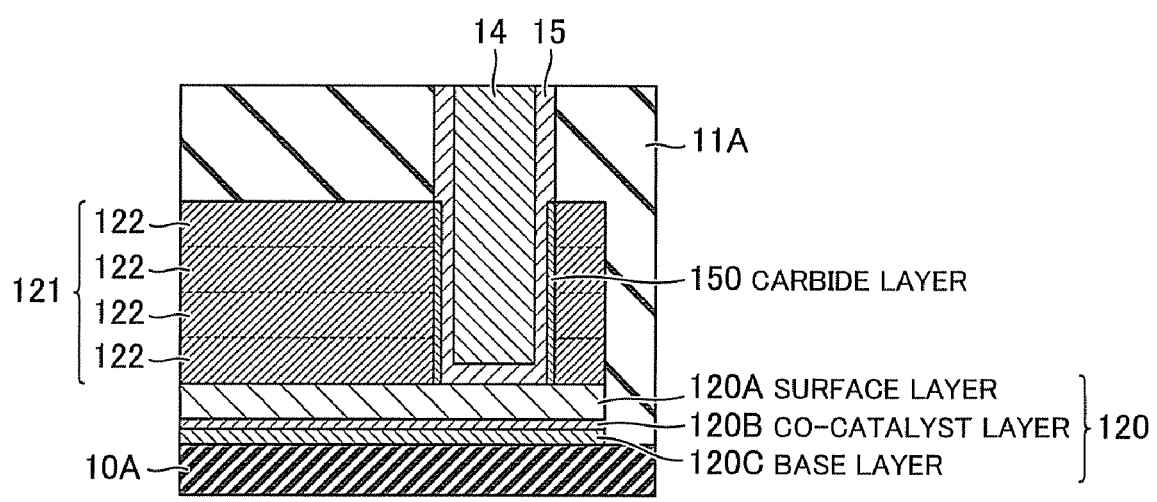
FIG. 2 is a partial enlarged view of a periphery of a GNR layer of FIG. 1A.

FIG. 2 is a partial enlarged view of a periphery of the GNR layer 121 of FIG. 1A. In the example shown in FIG. 2, the GNR layer 121 is composed of four GNR sheets 122. In addition, although it is not shown in the figures, the GNR layer 131 also has the same structure as the GNR layer 121.

The via 14 and the barrier metal 15 penetrate the GNR layer 131 and the catalyst layer 130 of the upper wiring 13 as well as at least one GNR sheet 122 of the GNR layer 121 of the lower wiring 12, and are connected to a GNR sheet of the GNR layer 131 and at least two GNR sheets 122.

As shown in FIG. 2, it is preferable that a carbide layer 150 is formed at an interface between the GNR layer 121 and the barrier metal 15 by a reaction of the GNR layer 121 with the barrier metal 15, and the laminated GNR sheets 122 of the GNR layer 121 are electrically connected each other via the carbide layer 150. As a result, it is possible to further reduce the electrical resistance at a connecting portion of the GNR layer 121 with the via 14 (the barrier metal 15). For example, when the barrier metal 15 is made of Ti, the carbide layer 150 is made of TiC. Note that, it is preferable that the same structure is also formed at a connecting portion of the GNR layer 131 with the via 14 (the barrier metal 15).

Alternatively, as shown in FIG. 2, the catalyst layer 120 may have a multilayer structure composed of a base layer 120C, a co-catalyst layer 120B and a surface layer 120A. The surface layer 120A is made of Co, Ni, Ru or Fe, etc., and functions as a catalyst for growing the GNR sheet 122. The co-catalyst layer 120B is made of Ti, etc., and functions as a co-catalyst of the surface layer 120A. Alternatively, the co-catalyst layer 120B may be an ultrathin layer composed of Ti fine particle. The base layer 120C is made of TaN, TiN, RuN, WN, Ta, Ti, Ru or W, etc., and has a function of preventing diffusion of metal contained in the surface layer 120A.

The insulating films 10A and 10B are made of insulating material such as SiN. Meanwhile, the interlayer insulating films 11A and 11B are preferably made of low dielectric constant insulating material such as SiOC-based insulating material.

An example of a method of fabricating the semiconductor device 100 according to the present embodiment will be described hereinafter.

FIGS. 3A to 3G are cross sectional views showing processes for fabricating the semiconductor device 100 according to the first embodiment.

Figure 3A:
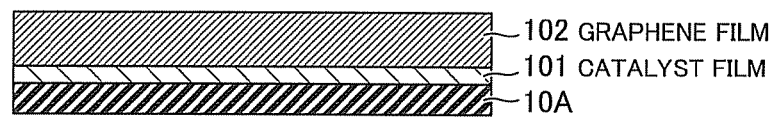
FIGS. 3A to 3G are cross sectional views showing processes for fabricating the semiconductor device according to the first embodiment.

Firstly, as shown in FIG. 3A, a catalyst film 101 which is a material film of the catalyst layer 120 and a graphene film 102 which is a material film of the GNR layer 121 are formed on the insulating film 10A The catalyst film 101 is formed by CVD (Chemical Vapor Deposition) or PVD (Physical Vapor Deposition), etc.

A specific example of a method of forming the graphene film 102 will be described below. Firstly, plasma treatment is performed for suppressing microparticulation of the catalyst film 101 due to agglomeration thereof. By preventing the microparticulation of the catalyst film 101 and maintaining continuity of the surface thereof, it is possible to promote uniform growth of graphene. Although a hydrogen gas or a noble gas is preferable as a discharge gas used for the plasma treatment, a mixture gas containing both of them may be used. The effect is higher at as low treatment temperature as possible, and it is desirable to perform at a room temperature. In addition, it is preferable that the plasma is relatively strong, and the effect is further increased when exposed to high power remote plasma or plasma.

Next, the catalyst film 101 is carbonized. A hydrocarbon-based gas such as methane or acetylene, or a mixture gas thereof is used as a discharge gas. In addition, a hydrogen gas or a noble gas, etc., is used for a carrier gas. It is necessary to perform this treatment at a temperature lower than the treatment temperature during the below-described graphene formation as well as at a temperature that a graphite film can be formed, and about 150-600° C. is preferable. In addition, the treatment time may be short. This treatment is also preferably performed using relatively strong plasma.

Next, the plasma treatment is performed for improving the quality of a carbonized layer of the catalyst film 101 and for activating the catalyst. It is preferable to use a noble gas for a discharge gas. The treatment temperature may be about intermediate between the treatment temperature for carbonizing the catalyst film 101 and that during the below-described graphene formation. The plasma used for this treatment may be relatively weak, and it is preferable to use remote plasma.

At the end, graphene is formed. A hydrocarbon-based gas or a mixture gas thereof is used as a discharge gas. The treatment temperature is about 200-1000° C., and about 350° C. is especially preferable. In case of below 200° C., a sufficient growth rate is not obtained and graphene growth hardly occurs. Under the temperature of 200° C. or more, the graphene growth occurs and a uniform graphene film is formed. This treatment temperature is equivalent to or less than that in a typical wiring formation process of a LSI device, and this graphene formation process is excellent in affinity to a semiconductor process.

In this treatment, since it is important to remove ions as well as electrons and to supply only radicals on the catalyst film 101, very weak remote plasma is desirably used. Applying voltage to a substrate by providing an electrode on an upper portion of the substrate is also effective in order to further remove ions and electrons. The applied voltage is preferably about 0 to ±100V.

The graphene film 102 is obtained by the above-mentioned multistep treatment. It is possible to form the graphene film 102 by the treatment using the CVD method under the single condition using a hydrocarbon-based gas as a carbon source, however, it is possible to form a low resistance graphene film 102 further excellent in uniformity under the low temperature condition by using the multistep treatment as described above.

Figure 3B:
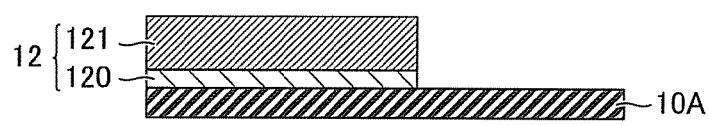

Next, as shown in FIG. 3B, the catalyst film 101 and the graphene film 102 are patterned by a combination of photolithography and RIE (Reactive Ion Etching), thereby shaped into the catalyst layer 120 and the GNR layer 121. As a result, the lower wiring 12 is obtained.

Note that, it is preferable that a termination process is performed on a side portion of the GNR layer 121 exposed by the patterning after the formation of the GNR layer 121. Here, the termination process means treatment for terminating dangling bond not having bondings at an end portion of the graphene, such as hydrogen sintering, silylation treatment or hydrophobizing treatment by HDMS. For example, when the silylation treatment is performed, it is possible to terminate the dangling bond by bonding hydrogen thereto, and when the silylation treatment or the hydrophobizing treatment by HDMS is performed, it is possible to terminate the dangling bond by bonding silicon-methyl group, etc., thereto.

When the dangling bond remains without being terminated, electron scattering is likely to occur at an end surface of the graphene and there is a possibility to adversely affect electron conduction properties in the graphene layer. In addition, in a state that the dangling bond remains, unintentional bonding may be formed at a graphene edge, and there is a possibility to adversely affect the electron conduction properties in the graphene in this case as well.

Figure 3C:
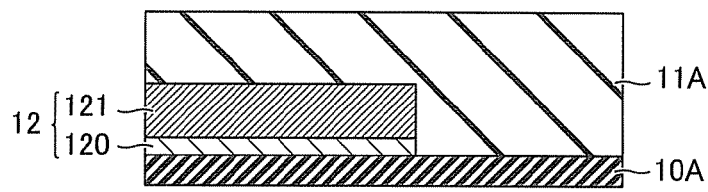

Next, as shown in FIG. 3C, the interlayer insulating film 11A is formed. The interlayer insulating film 11A is formed by CVD, etc., so as to cover the lower wiring 12, and is subsequently planarized by planarization treatment such as CMP (Chemical Mechanical Polishing).

Figure 3D:
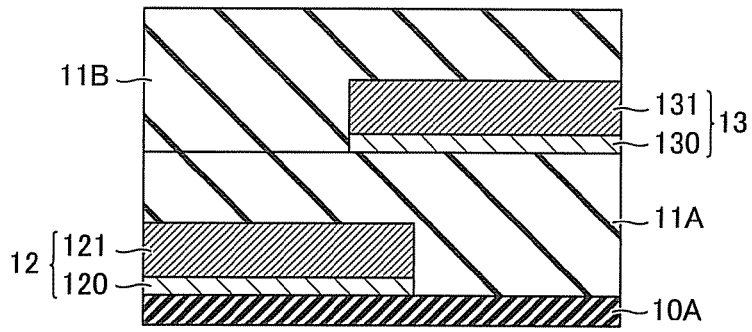

Next, as shown in FIG. 3D, the upper wiring 13 and the interlayer insulating film 11B are formed on the interlayer insulating film 11A. The upper wiring 13 and the interlayer insulating film 11B are respectively formed by the same methods as used to form the lower wiring 12 and the interlayer insulating film 11A.

Figure 3E:
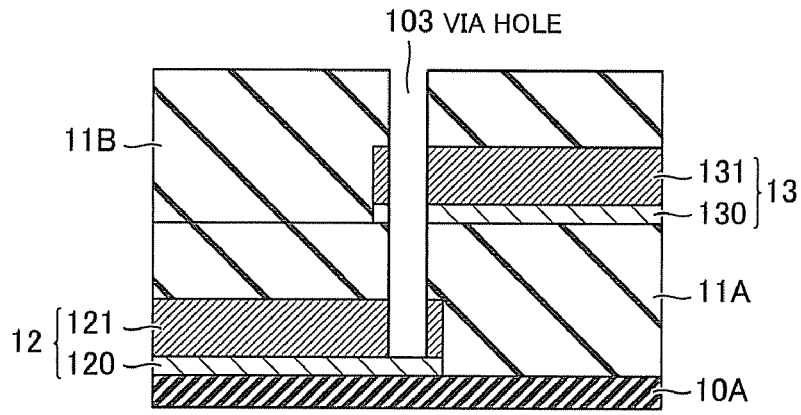

Next, as shown in FIG. 3E, a via hole 103 is formed in the interlayer insulating film 11B, the GNR layer 131, the catalyst layer 130, the interlayer insulating film 11A and the GNR layer 121 by a combination of photolithography and RIE, etc.

Since materials of the catalyst layer 120 and the GNR layer 121 can be selected so that the catalyst layer 120 has a sufficient etching selectivity with respect to the GNR layer 121, it is possible to form the via hole 103 using a catalyst layer 120 as an etching stopper.

A fluorine-based gas, etc., is used as a gas for etching the interlayer insulating films 11A and 11B. Meanwhile, an oxygen-based gas, etc., is used as a gas for etching the GNR layers 121 and 131. In addition, a Cl (chlorine)-based gas, etc., is used as a gas for etching the catalyst layer 120 and 130.

Figure 3F:
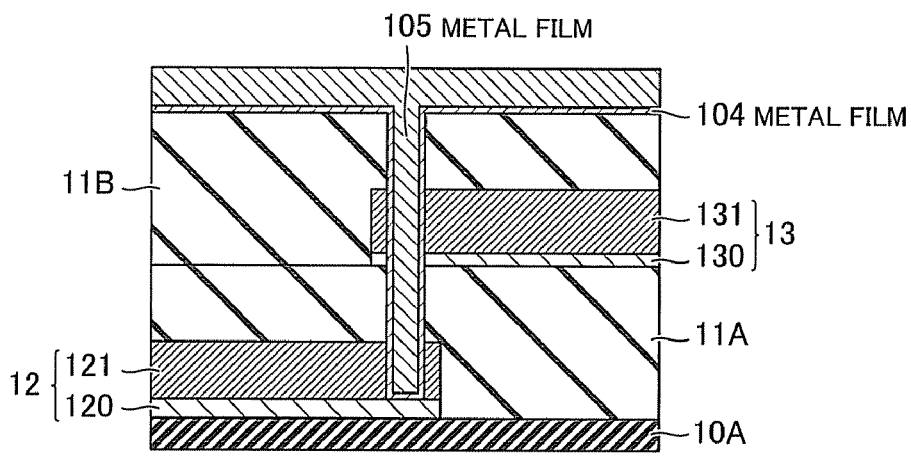

Next, as shown in FIG. 3F, a metal film 104 which is a material film of the barrier metal 15 and a metal film 105 which is a material film of the via 14 are formed by CVD, etc., so as to fill the via hole 103.

Figure 3G:
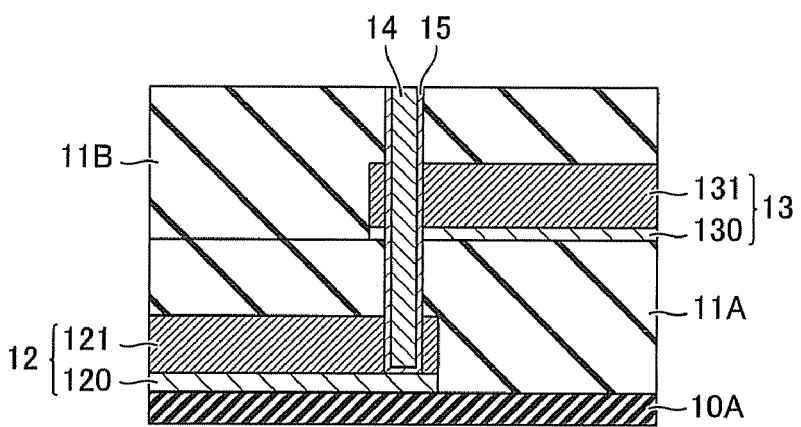

Next, as shown in FIG. 3G, the metal films 104 and 105 outside of the via hole 103 are removed by the planarization treatment such as CMP, thereby respectively shaping into the barrier metal 15 and the via 14.

Subsequently, the insulating film 10B is formed on the interlayer insulating film 11B by CVD, etc. As a result, the semiconductor device 100 shown in FIGS. 1A and 1B is obtained.

(Effect of the First Embodiment)

According to the first embodiment, since the lower wiring 12 and the upper wiring 13 include the GNR layers 121 and 131, it is possible to reduce the electrical resistance by using the ballistic conductivity of the graphene.

In addition, since the via 14 (the barrier metal 15) is directly connected to each of the laminated graphene nanoribbon sheets of the GNR layers 121 and 131, it is possible to allow each graphene nanoribbon sheet to function as a current path in the wiring without increasing the complexity of the connecting portion of the lower wiring 12 with the via 14 and that of the upper wiring 13 with the via 14. Thus, it is possible to reduce the electrical resistance by accurately connecting the lower wiring 12 to the via 14 and the upper wiring 13 to the via 14, and to reduce the fabrication steps of the wiring structure.

Note that, the configurations of the wiring and the wiring connecting member are not limited to those composed of the lower wiring 12, the upper wiring 13, the via 14 and the barrier metal 15 shown in the present embodiment. For example, a contact plug connecting a wiring to an element therebelow and a barrier metal on a surface of the contact plug may be used as a wiring connecting member. In this case, structures of a connecting portion of the wiring with the contact plug and the barrier metal are the same as the structures of the connecting portion of the upper wiring 13 with the via 14 and the barrier metal 15 in the present embodiment.

[Second Embodiment]

The second embodiment is different from the first embodiment in that the wiring has plural laminated GNR layers. Note that, the explanation will be omitted or simplified for the same points as the first embodiment.

Figure 4:
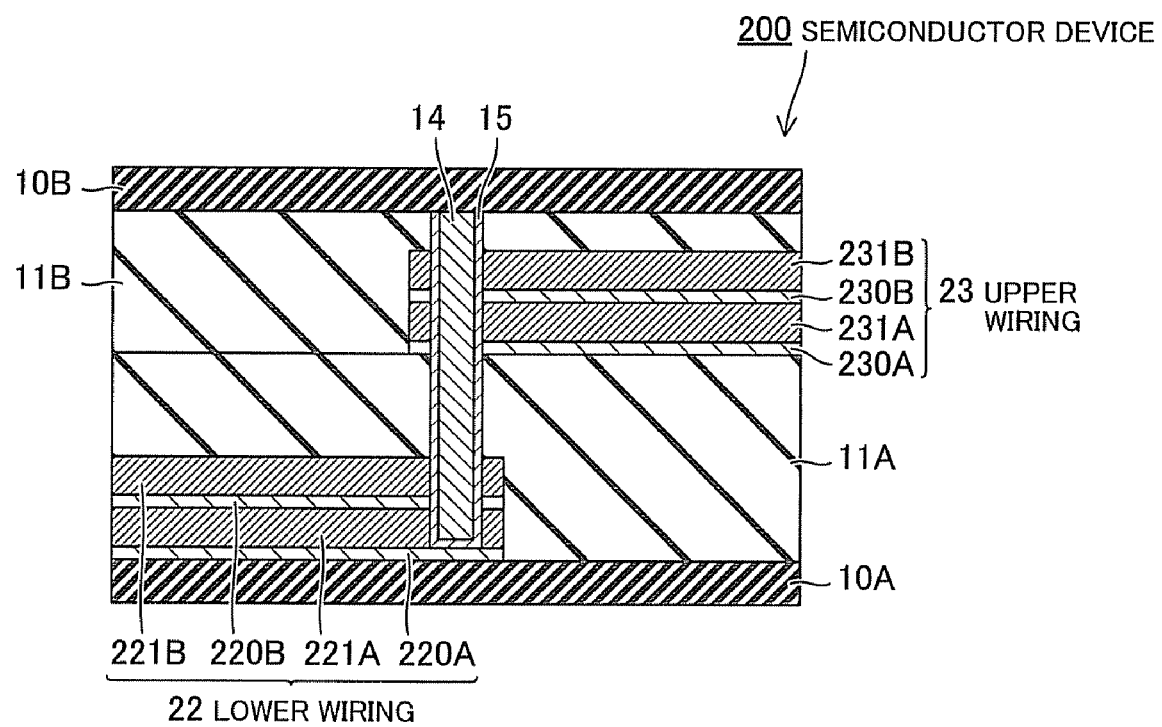
FIG. 4 is a vertical cross sectional view of a semiconductor device according to a second embodiment.

FIG. 4 is a vertical cross sectional view of a semiconductor device 200 according to a second embodiment.

The semiconductor device 200 has an insulating film 10A formed above a non-illustrated semiconductor substrate, an interlayer insulating film 11A on the insulating film 10A, an interlayer insulating film 11B on the interlayer insulating film 11A, an insulating film 10B on the interlayer insulating film 11B, a lower wiring 22 in the interlayer insulating film 11A, an upper wiring 23 in the interlayer insulating film 11B, and a via 14 for electrically connecting the lower wiring 22 to the upper wiring 23.

The lower wiring 22 has a structure in which two pairs of catalyst layer and GNR layer, which are composed of catalyst layers 220A, 220B and GNR layers 221A and 221B, are laminated. Alternatively, the lower wiring 22 may have a structure in which three or more pairs of catalyst layer and GNR layer are laminated.

The upper wiring 23 has a structure in which two pairs of catalyst layer and GNR layer, which are composed of catalyst layers 230A, 230B and GNR layers 231A and 231B, are laminated. Alternatively, the upper wiring 23 may have a structure in which three or more pairs of catalyst layer and GNR layer are laminated.

The catalyst layers 220A, 220B, 230A and 230B have the same characteristics as the catalyst layers 120 and 130 in the first embodiment, and are formed by the same method. Meanwhile, the GNR layers 221A, 221B, 231A and 231B have the same characteristics as the GNR layers 121 and 131 in the first embodiment, and are formed by the same method.

Similarly to the GNR layers 121 and 131 in the first embodiment, the GNR layers 221A, 221B, 231A and 231B are preferably composed of 10 layers or less of GNR sheets. Therefore, although improvement in the conduction properties is not expected even if the layer number of the GNR sheets in one GNR layer is increased, it is possible to improve the conduction properties of the wiring by forming laminated plural pairs of catalyst layer and GNR layer, as is in the present embodiment.

(Effect of the Second Embodiment)

According to the second embodiment, since the lower wiring 22 has a structure in which two pairs of catalyst layer and GNR layer, which are composed of the catalyst layers 220A, 220B and the GNR layers 221A and 221B, are laminated, it is possible to further improve the conduction properties of the lower wiring 22. In addition, since the upper wiring 23 has a structure in which two pairs of catalyst layer and GNR layer, which are composed of the catalyst layers 230A, 230B and the GNR layers 231A and 231B, are laminated, it is possible to further improve the conduction properties of the upper wiring 23.

[Third Embodiment]

The third embodiment is different from the second embodiment in that plural upper wirings are connected to a lower wiring. Note that, the explanation will be omitted or simplified for the same points as the second embodiment.

Figure 5:
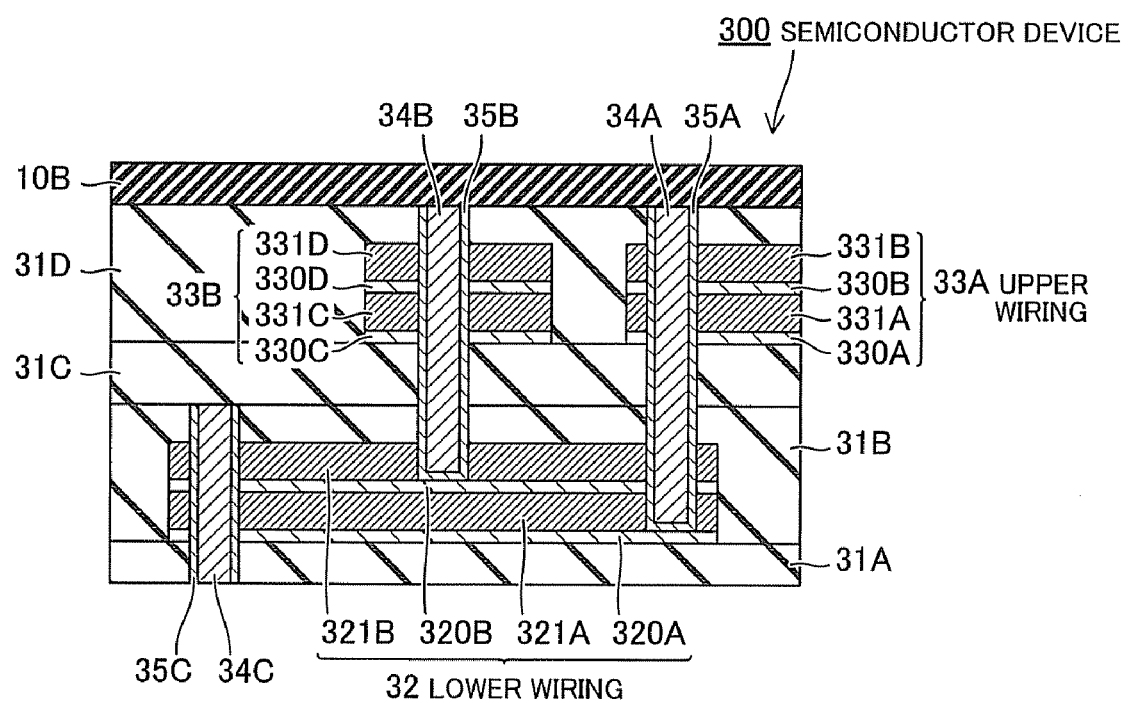
FIG. 5 is a vertical cross sectional view of a semiconductor device according to a third embodiment.

FIG. 5 is a vertical cross sectional view of a semiconductor device 300 according to a third embodiment.

The semiconductor device 300 has an interlayer insulating film 31A formed above a non-illustrated semiconductor substrate, an interlayer insulating film 31B on the interlayer insulating film 31A, an interlayer insulating film 31C on the interlayer insulating film 31B, an interlayer insulating film 31D on the interlayer insulating film 31C, an insulating film 10B on the interlayer insulating film 31D, a lower wiring 32 in the interlayer insulating film 31B, upper wirings 33A and 33B in the interlayer insulating film 31D, a via 34A for electrically connecting the lower wiring 32 to the upper wiring 33A, a via 34B for electrically connecting the lower wiring 32 to the upper wiring 33B, and a via 34C for electrically connecting the lower wiring 32 to a conductive member therebelow.

The lower wiring 32 has the same characteristics as the lower wiring 22 in the second embodiment. Meanwhile, the upper wirings 33A and 33B have the same characteristics as the upper wiring 23 in the second embodiment.

The vias 34A, 34B and 34C are made of the same material as the via 14 in the first embodiment. Meanwhile, barrier metals 35A, 35B and 35C are made of the same material as the barrier metal 15 in the first embodiment.

The via 34A and the barrier metal 35A penetrate GNR layers 331A, 331B and catalyst layers 330A and 330B of the upper wiring 33A, and GNR layers 321A, 321B and catalyst layer 320B of the lower wiring 32.

The via 34B and the barrier metal 35B penetrate GNR layers 331C, 331D and catalyst layers 330C and 330C of the upper wiring 33B, and the GNR layers 321B of the lower wiring 32.

The via 34C and the barrier metal 35C penetrate the GNR layers 321A, 321B and the catalyst layers 320A and 320B of the lower wiring 32.

When the via 34A and the barrier metal 35A as well as the via 34B and the barrier metal 35B both penetrate the GNR layers 321A and 321B, the presence of the via 34B disturbs the ballistic conduction between the vias 34C and 34A. Note that, when the semiconductor device 300 has an ultrafine wiring structure, since the GNR layers 321A and 321B made of graphene nanoribbon has a narrow line width, it is difficult to sufficiently reduce a diameter of the via 34B with respect to the line width of the GNR layers 321A and 321B so as not to disturb the ballistic conduction.

In the present embodiment, the via 34A and the barrier metal 35A are connected to the GNR layer 321A of the lower wiring 32 but the via 34B and the barrier metal 35B are not connected thereto. Thus, the ballistic conduction between the vias 34C and 34A is not disturbed in the GNR layer 321A, and it is possible to set the resistance between the vias 34C and 34A lower similarly to the resistance between the vias 34C and 34B.

Note that, since the ballistic conduction occurs independently in each GNR sheet in the GNR layers 321A and 321B, if the height of the bottom surface of the via 34A is lower than that of the via 34B, a path in which the ballistic conduction is not disturbed is formed between the vias 34C and 34A. In other words, for example, the height of the bottom surface of the barrier metal 35B may be between the heights of upper and lower surfaces of the GNR layer 321A or between the heights of upper and lower surfaces of the GNR layer 321B.

However, since materials of the catalyst layer 320B and the GNR layer 321B can be selected so that the catalyst layer 320B has a sufficient etching selectivity with respect to the GNR layer 321B, it is easy to form a via hole for the via 34B and the barrier metal 35B using the catalyst layer 320B as an etching stopper in the fabrication process. In this case, as shown in FIG. 5, the bottom surface of the barrier metal 35B contacts with the GNR layer 321B.

In addition, even in the case that there is a pair or three or more pairs of catalyst layer and GNR layer which compose the lower wiring 32, when the height of the bottom surface of the via 34A is lower than that of the via 34B, a path in which the ballistic conduction is not disturbed is formed between the vias 34C and 34A.

In addition, when three or more vias which connect the lower wiring 32 to the upper conductive member are formed, it is possible to form a path in which the ballistic conduction is not disturbed between the via 34C and each via by arranging the vias in order of lowering height of bottom surface from a position closer to the via 34C.

In addition, when the vias 34A and 34B are each connected to the lower conductive member instead of being connected to the upper wirings 33A and 33B, it is possible to form a path in which the ballistic conduction is not disturbed between the vias 34C and 34A and between the vias 34C and 34B by lowering the height of the upper surface of the via 34B than that of the via 34A (by arranging the vias in order of heightening height of upper surface from a position closer to the via 34C).

Note that, also in case that the via 34A connects the lower wiring 32 to the conductive member thereabove, the condition for forming a path in which the ballistic conduction is not disturbed between the vias 34C and 34A and between the vias 34C and 34B is the same.

In summary, when the lower wiring 32 includes the GNR sheet connected to the vias 34A, 34B and 34C and the GNR sheet connected to only the vias 34A and 34C, a path in which the ballistic conduction is not disturbed is formed between the vias 34C and 34A and between the vias 34C and 34B.

The interlayer insulating films 31A, 31B, 31C and 31D are made of the same material as the interlayer insulating films 11A and 11B in the first embodiment.

An example of a method of fabricating the semiconductor device 300 according to the present embodiment will be described hereinafter.

FIGS. 6A to 6G are cross sectional views showing processes for fabricating the semiconductor device 300 according to the third embodiment.

Figure 6A:
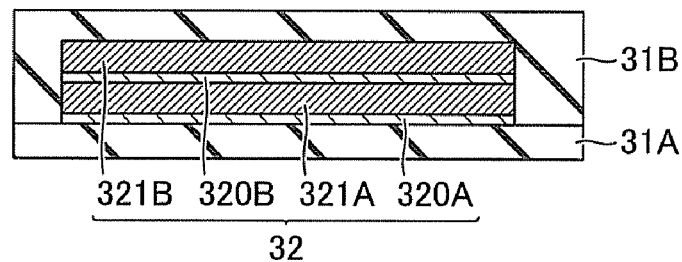
FIGS. 6A to 6G are cross sectional views showing processes for fabricating the semiconductor device according to the third embodiment.

Firstly, as shown in FIG. 6A, the lower wiring 32 and the interlayer insulating film 31B are formed on the interlayer insulating film 31A.

Material films of the catalyst layers 320A, 320B and the GNR layers 321A and 321B are formed in the same manner as the catalyst film 101 and the graphene film 102 in the first embodiment, and are patterned, thereby forming the lower wiring 32. The interlayer insulating film 31B is formed by CVD, etc., so as to cover the lower wiring 32, and is subsequently planarized by the planarization treatment such as CMP.

Figure 6B:
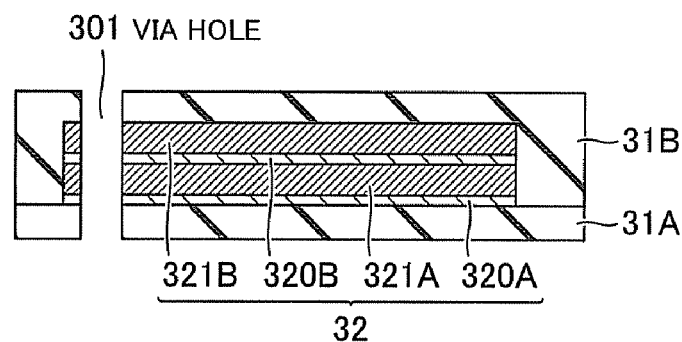

Next, as shown in FIG. 6B, a via hole 301 is formed in the interlayer insulating film 31B, the GNR layer 321B, the catalyst layer 320B, the GNR layer 321A, the catalyst layer 320A and the interlayer insulating film 31A by a combination of photolithography and RIE, etc.

Figure 6C:
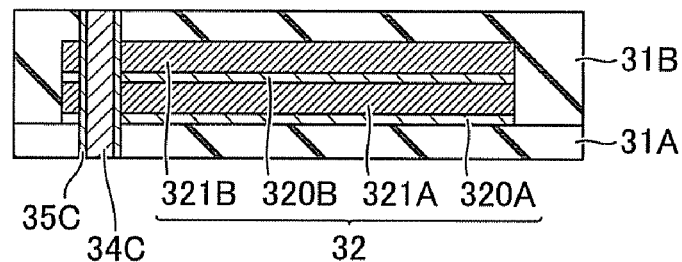

Next, as shown in FIG. 6C, the barrier metal 35C and the via 34C are formed in the via hole 301. The barrier metal 35C and the via 34C are formed by the same method as used to form the barrier metal 15 and the via 14 in the first embodiment.

Figure 6D:
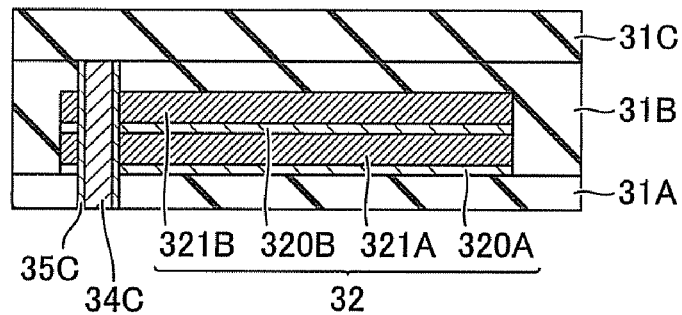

Next, as shown in FIG. 6D, the interlayer insulating film 31C is formed on the interlayer insulating film 31B by CVD, etc.

Figure 6E:
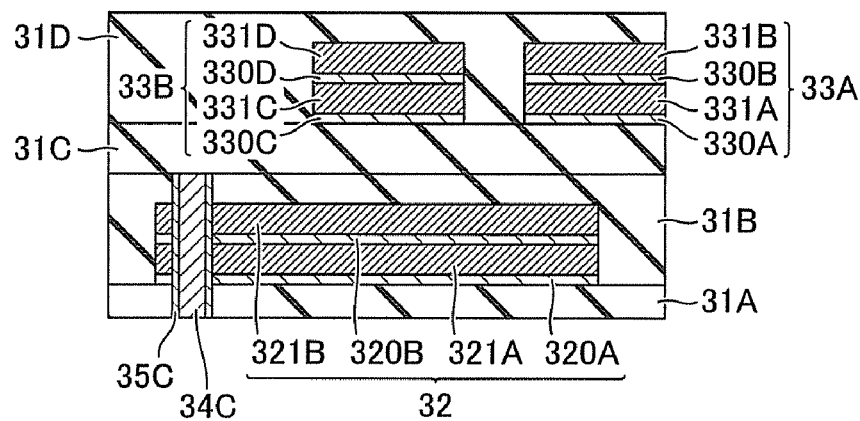

Next, as shown in FIG. 6E, the upper wirings 33A, 33B and the interlayer insulating film 31D are formed on the interlayer insulating film 31C.

A material film of the catalyst layers 330A and 330C, that of the GNR layers 331A and 331C, that of the catalyst layers 330B and 330D, and that of the GNR layers 331B and 331D are laminated and patterned, thereby forming the upper wirings 33A and 33B. The interlayer insulating film 31D is formed by CVD, etc., so as to cover the upper wirings 33A and 33B, and is subsequently planarized by the planarization treatment such as CMP.

Figure 6F:
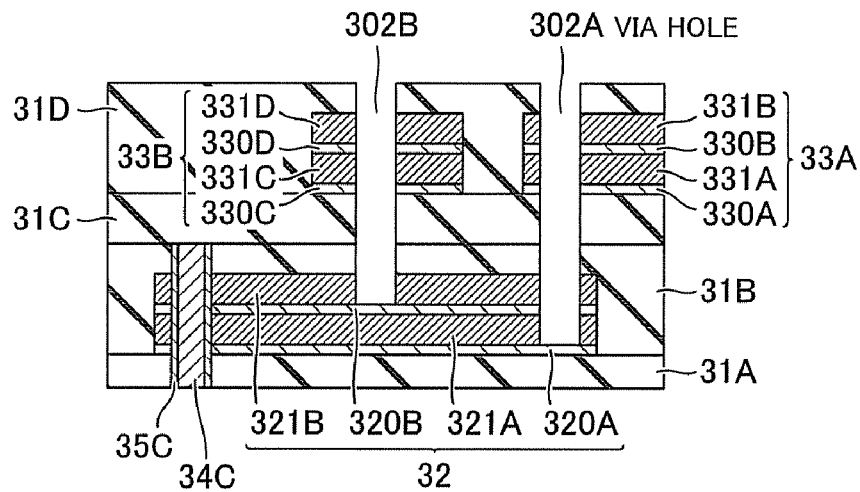

Next, as shown in FIG. 6F, via holes 302A and 302B are formed by a combination of photolithography and RIE, etc.

The via hole 302A is formed in the interlayer insulating film 31D, the upper wiring 33A, the interlayer insulating films 31C, 31B and the GNR layer 3213, the catalyst layer 320B and the GNR layer 321A of the lower wiring 32 by etching using the catalyst layer 320A as an etching stopper. Thus, the catalyst layer 320A is exposed on the bottom surface of the via hole 302A.

The via hole 302B is formed in the interlayer insulating film 31D, the upper wiring 33B, the interlayer insulating films 31C, 315 and the GNR layer 321B of the lower wiring 32 by etching using the catalyst layer 320B as an etching stopper. Thus, the catalyst layer 320B is exposed on the bottom surface of the via hole 302B.

Figure 6G:
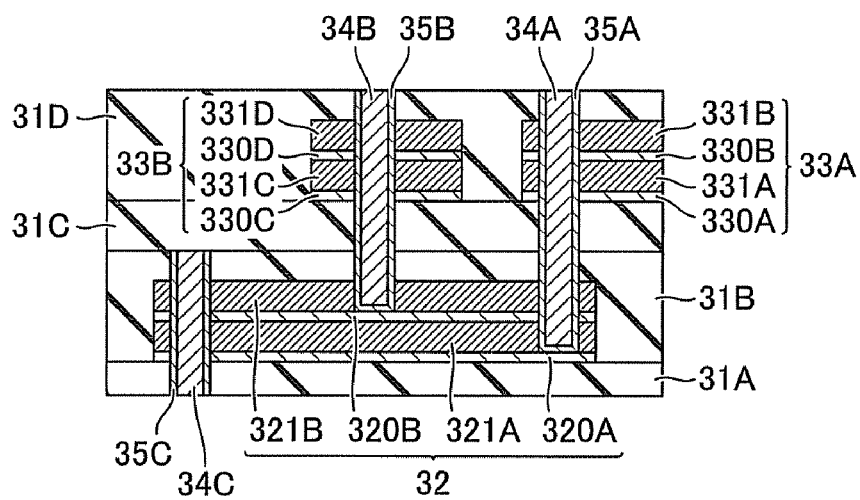

Next, as shown in FIG. 6G, the barrier metal 35A and the via 34A are formed in the via hole 302A, and the barrier metal 35B and the via 34B are formed in the via hole 302B.

A material film of the barrier metals 35A and 35B and that of the vias 34A and 34B are formed in the via holes 302A and 302B, and the material films outside of the via holes 302A and 302B are substantially removed by the planarization treatment such as CMP, thereby forming the vias 34A and 34B and the barrier metals 35A and 35B.

Subsequently, the insulating film 10B is formed on the interlayer insulating film 31D by CVD, etc. As a result, the semiconductor device 300 shown in FIG. 5 is obtained.

(Effect of the Third Embodiment)

According to the third embodiment, the lower wiring 32 includes the GNR sheet connected to the vias 34A, 34B and 34C and the GNR sheet connected to only the vias 34A and 34C, and it is thereby possible to form a path in which the ballistic conduction is not disturbed between the vias 34C and 34A and between the vias 34C and 34B.

[Other Embodiments]

It should be noted that the present invention is not intended to be limited to the above-mentioned first to third embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A semiconductor device, comprising:
   a substrate;
   a wiring provided above the substrate and including a graphene nanoribbon layer comprising a plurality of laminated graphene nanoribbon sheets; and
   a wiring connecting member penetrating at least one of the plurality of graphene nanoribbon sheets for connecting the wiring and a conductive member above or below the wiring.

2. The semiconductor device according to claim 1, wherein the wiring includes two or more of the laminated graphene nanoribbon layers; and
   the two or more graphene nanoribbon layers are each provided on a catalyst layer and each comprise graphene that is grown by using the catalyst layer as a catalyst.

3. The semiconductor device according to claim 2, wherein the wiring connecting member includes a first wiring connecting member, a second wiring connecting member, and a third wiring connecting member located between the first and second wiring connecting members; and
   the plurality of graphene nanoribbon sheets includes first and second graphene nanoribbon sheets, the first graphene nanoribbon sheet being connected to the first, second and third wiring connecting members, and the second graphene nanoribbon sheet being connected to only the first and second wiring connecting members among the first, second and third wiring connecting members.

4. The semiconductor device according to claim 3, wherein the second and third wiring connecting members are each connected to a conductive member above the wiring;
   a bottom of the second wiring connecting member is in contact with a first catalyst layer included in the catalyst layers; and
   a bottom of the third wiring connecting member is in contact with a second catalyst layer included in the catalyst layers above the first catalyst layer.

5. The semiconductor device according to claim 4, further comprising:
   a carbide layer located at an interface between the wiring connecting member and graphene nanoribbon sheets in contact therewith, the graphene nanoribbon sheets in contact with the wiring connecting member being connected each other via the carbide layer.

6. The semiconductor device according to claim 1, wherein the wiring includes a catalyst layer and the graphene nanoribbon layer thereon; and
   the wiring connecting member connects the wiring to an conductive member thereabove and includes a wiring connecting member having a bottom in contact with the catalyst layer.

7. The semiconductor device according to claim 6, further comprising:
   a carbide layer located at an interface between the wiring connecting member and graphene nanoribbon sheets in contact therewith, the graphene nanoribbon sheets in contact with the wiring connecting member being connected each other via the carbide layer.

8. The semiconductor device according to claim 6, wherein the catalyst layer includes a base layer and a surface layer thereabove, the surface layer having a function as a catalyst for growing grapheme, and the base layer having a function of preventing diffusion of metal in the surface layer.

9. The semiconductor device according to claim 1, wherein the wiring connecting member includes a first wiring connecting member, a second wiring connecting member, and a third wiring connecting member located between the first and second wiring connecting members; and
   the plurality of graphene nanoribbon sheets includes first and second graphene nanoribbon sheets, the first graphene nanoribbon sheet being connected to the first, second and third wiring connecting members, and the second graphene nanoribbon sheet being connected to only the first and second wiring connecting members among the first, second and third wiring connecting members.

10. The semiconductor device according to claim 1, further comprising:

a carbide layer located at an interface between the wiring connecting member and graphene nanoribbon sheets in contact therewith, the graphene nanoribbon sheets in contact with the wiring connecting member being connected each other via the carbide layer.

11. A method of fabricating a semiconductor device, comprising:
forming a wiring above the substrate, the wiring including a graphene nanoribbon layer comprising a plurality of laminated graphene nanoribbon sheets;
forming a hole penetrating at least one of the plurality of graphene nanoribbon sheets; and
forming a wiring connecting member for connecting the wiring and a conductive member above or below the wiring by providing a conductive member into the hole.

12. The method of fabricating a semiconductor device according to claim 11, wherein the wiring includes two or more of the laminated graphene nanoribbon layers; and
the two or more graphene nanoribbon layers are each provided on a catalyst layer and each comprise graphene that is grown by using the catalyst layer as a catalyst.

13. The method of fabricating a semiconductor device according to claim 12, wherein the hole includes a first hole, a second hole and a third hole located between the first and second holes; and
the first, second and third holes are formed on a portion of the plurality of the graphene nanoribbon sheets and only the first and second holes among the first, second and third holes are formed on another portion.

14. The method of fabricating a semiconductor device according to claim 13, wherein a first catalyst layer included in the catalyst layers is exposed on a bottom of the second hole; and
a second catalyst layer included in the catalyst layers above the first catalyst layer is exposed on a bottom of the third hole.

15. The method of fabricating a semiconductor device according to claim 14, further comprising:
forming a carbide layer by reacting the wiring connecting member with a graphene nanoribbon sheets in contact therewith, the graphene nanoribbon sheets in contact with the wiring connecting member being connected each other via the carbide layer.

16. The method of fabricating a semiconductor device according to claim 11, wherein the wiring includes a catalyst layer and the graphene nanoribbon layer thereon, the graphene nanoribbon layer comprising graphene that is grown by using the catalyst layer as a catalyst; and
the hole includes a hole having a bottom in contact with the catalyst layer.

17. The method of fabricating a semiconductor device according to claim 16, further comprising:
forming a carbide layer by reacting the wiring connecting member with a graphene nanoribbon sheets in contact therewith, the graphene nanoribbon sheets in contact with the wiring connecting member being connected each other via the carbide layer.

18. The method of fabricating a semiconductor device according to claim 16, wherein the catalyst layer includes a base layer and a surface layer thereabove, the surface layer having a function as a catalyst for growing grapheme, and the base layer having a function of preventing diffusion of metal in the surface layer.

19. The method of fabricating a semiconductor device according to claim 11, wherein the hole includes a first hole, a second hole and a third hole located between the first and second holes; and
the first, second and third holes are formed on a portion of the plurality of the graphene nanoribbon sheets and only the first and second holes among the first, second and third holes are formed on another portion.

20. The method of fabricating a semiconductor device according to claim 11, further comprising:
forming a carbide layer by reacting the wiring connecting member with a graphene nanoribbon sheets in contact therewith, the graphene nanoribbon sheets in contact with the wiring connecting member being connected each other via the carbide layer.

* * * * *